United States Patent [19]

Naraoka et al.

[11] 3,746,944

[45] July 17, 1973

[54] CONTACT MEMBERS FOR SILICON SEMICONDUCTOR DEVICES

[75] Inventors: Kiyotake Naraoka; Hisumi Sano, both of Tokyo; Yokichi Itoh, Hachioji, all of Japan

[73] Assignee: Hitachi, Ltd., Tokyo, Japan

[22] Filed: July 12, 1971

[21] Appl. No.: 161,786

[30] Foreign Application Priority Data

July 10, 1970 Japan ............................... 45/59913

[52] U.S. Cl. ....... 317/234 R, 317/234 L, 317/234 M

[51] Int. Cl. ............................................. H01l 3/00

[58] Field of Search ....................... 317/234, 5.2, 5.3

[56] References Cited

UNITED STATES PATENTS

| | | | |
|---|---|---|---|
| 3,582,324 | 6/1971 | Kunert et al. | 75/134 |
| 3,545,076 | 12/1970 | Schulten | 29/578 |
| 3,508,124 | 4/1970 | Boule et al. | 317/234 |
| 3,566,209 | 2/1971 | Shaw | 317/235 |

*Primary Examiner*—John W. Huckert
*Assistant Examiner*—E. Wojciechowicz
*Attorney*—Craig, Antonelli & Hill

[57] ABSTRACT

A contact and interconnection arrangement for a silicon semiconductor device with a silicon oxide coating, which comprises a double layer composed of a thin layer of molybdenum-nickel alloy and a thin layer of gold, or which comprises a triple layer composed of a thin layer of molybdenum-nickel alloy, a thin layer of silver or copper, and a thin layer of gold, whereby the molybdenum-nickel alloy contains 5 to 50 percent of nickel by weight.

7 Claims, 7 Drawing Figures

INVENTORS
KIYOTAKE NARAOKA, HISUMI SANO,
BY YOKICHI ITOH
Craig, Antonelli & Hill
ATTORNEYS INVENTORS
KIYOTAKE NARAOKA, HISUMI SANO,
BY YOKICHI ITOH
Craig, Antonelli & Hill
ATTORNEYS INVENTOR
KIYOTAKE NARAOKA, HISUMI SANO,
BY YOKICHI ITOH
Craig, Antonelli & Hill
ATTORNEYS

CONTACT MEMBERS FOR SILICON SEMICONDUCTOR DEVICES

BACKGROUND OF THE INVENTION

1. Field of the Invention

This invention relates to semiconductor devices comprising silicon wafers and more particularly to metal contact and interconnection arrangements for transistors, integrated circuits, or the like.

2. Description of the Prior Art

For example, in planar transistors, usually a silicon oxide coating overlies its silicon surface excepting the base-emitter contact area, and strips of thin metallic layer are extended over the silicon oxide coating from the contact area. In this structure, the metallic contact layer should have an ohmic contact with the silicon providing a low resistance. At the same time, the metallic contact layer is supposed to establish good adherence to the silicon oxide, without affecting the silicon or silicon oxide or without being diffused into the silicon or silicon oxide.

Compared with the aluminum evaporation layer which has hitherto been used for electrode contacts and interconnections, the gold evaporation layer can be used at a large current density because the gold evaporation layer hardly gives rise to electromigration. The gold layer is excellent in anticorrosiveness and malleability, and can establish a metallurgically stable contact with a gold wire by thermocompression bonding. By virtue of these features, the gold layer has been used for contacts and interconnections in semiconductor devices whose reliability must be high.

However, gold forms a eutectic alloy with silicon at a low temperature, thereby deteriorating the characteristics of the semiconductor device. The gold layer can not establish good adherence with silicon oxide and, hence, the use of gold layer alone is not sufficient for the semiconductor device to maintain the desirable characteristics.

To solve the foregoing problem a molybdenum-gold double layer has been proposed for use as a metallic contact layer. The semiconductor device with such double layer is formed in the following manner.

A window for a contact lead is disposed by photoengraving method on an oxide layer formed on the surface of a silicon wafer comprising a planar semiconductor device, for which the process of impurity diffusion such as base and emitter diffusion has been completed, and then a molybdenum layer is deposited on the oxide layer by sputtering or evaporation techniques and then, a gold layer is deposited on the molybdenum layer whereby a double layer composed of a molybdenum layer and of a gold layer is formed. Then, by forming a conductor pattern on this double layer by photoengraving, a semiconductor device having a contact of molybdenum-gold double layer is obtained.

In the semiconductor device formed in the above manner, the molybdenum layer establishes better adherence with the silicon oxide present on the surface of the semiconductor device and serves as the barrier for preventing gold from being diffused into silicon and silicon oxide and also as the metal to be in contact with silicon, while the gold layer serves as the metal for connecting the electrical conductor to external circuits.

In this semiconductor device, there exists, however a problem; namely, the contact resistance of molybdenum to silicon is too high.

More specifically, the specific resistivity of silicon is normally 0.01 to 0.05Ωcm in the base region of transistor. It is known that if molybdenum comes into ohmic contact with p-type and n-type silicon having such a specific resistivity, the ohmic contact resistance against n-type silicon with a specific resistivity of 0.01Ωcm is about $3 \times 10^{-3}\Omega/cm^2$, and that against p-type silicon with a specific resistivity of 0.01Ωcm is about $2 \times 10^{-4}\Omega/cm^2$. Hence, if the area of the contact between molybdenum and silicon is small, the contact resistance will be fairly high, such as greater than 10Ω.

In the semiconductor device, the presence of a contact resistance of more than several ohms serves to deteriorate the high frequency characteristics and to produce heat by power loss and thus to lower the output.

To realize a low contact resistance between molybdenum and silicon in the semiconductor device, the following method is generally employed.

Aluminum is evaporated thinly onto the silicon wafer, and a molybdenum-gold double layer is formed on the aluminum layer, or a platinum silicide layer is formed on the silicon wafer and then a molybdenum-gold double layer is formed on the platinum silicide layer.

According to this method, however, the number of thin-layer-forming steps is increased and complicated heat treatment and etching steps are additionally required. Furthermore, in the method using aluminum evaporation techniques in the foregoing manner, it is often the case that aluminum is diffused to a greater extent than molybdenum. This deteriorates the shallow emitter-base junction characteristics and increases the fraction of defective devices.

SUMMARY OF THE INVENTION

In view of the foregoing, a general object of this invention is to provide an improved contact and interconnection arrangement for semiconductor devices, especially for integrated circuits having a silicon oxide coating and for silicon planar transistors.

Briefly the arrangement of this invention is characterized in that the contact layer and interconnection layer establish good adherence with the surfaces of silicon and silicon oxide without any accompanying undesirable reactions, the etching steps can be effectively applied to these layers, these layers are easily deposited onto the surface of the silicon wafer by vacuum evaporation or sputtering techniques, and these layers have a high conductivity and permit stable connection with gold lead wires.

To realize the above objects in an optimum manner, one preferred embodiment of this invention proposes a double layer consisting of a thin layer of a molybdenum-nickel alloy with a nickel silicide layer formed on the silicon surface, which alloy layer contains 5 to 50 percent of nickel by weight, and a thin gold layer formed on the thin molybdenum-nickel alloy layer. Instead of this double layer, a triple layer having a thin silver or copper layer interposed between the gold layer and the alloy layer may be used whereby similar effects as obtainable in the double layer are realized.

The contact and interconnection arrangement using such double layer or triple layer is realized in the following manner.

A thin molybdenum-nickel alloy layer is formed by the vacuum evaporation or sputtering method on the whole surface of a semiconductor wafer such as, for example, a silicon wafer having a silicon oxide coating, whereby the part of the silicon oxide coating corresponding to the contact region is removed by etching. In this process, the silicon wafer is heated to about 600° to about 700° C when forming the molybdenum-nickel alloy layer, or heated to about 200° to about 400° C when forming the molybdenum-nickel alloy layer and, after forming the molybdenum-nickel alloy layer, the silicon wafer is heated to about 600° to about 700° C and a nickel silicide layer is formed between the silicon wafer and the molybdenum-nickel alloy layer. A thin gold layer is formed directly or by way of a thin copper or silver layer on the molybdenum-nickel alloy layer by vacuum evaporation or sputtering techniques. Then, part of the gold layer and molybdenum-nickel alloy layer or part of the gold layer, silver layer and molybdenum-nickel alloy layer or part of the gold layer, copper layer and molybdenum-nickel alloy layer is removed by etching whereby the desired pattern of contacts and interconnections is formed on the surface of the silicon wafer and silicon oxide coating.

Gold has a high conductivity and permits easy formation of a thin layer by evaporation or sputtering. In addition, the gold layer is well suited for photoresist and etching processes and facilitates connection to gold lead wires.

As described above, the silver or copper layer does not form a good adherence with the silicon oxide coating. It is therefore necessary to form a gold, silver or copper layer in good adherence with the back surface of the molybdenum-nickel alloy layer. The molybdenum-nickel alloy layer can establish good adherence with the silicon oxide and is hardly alloyable with gold, silver and copper. Also, the molybdenum-nickel alloy layer can be etched by a suitable etching solution without ruining other parts. The molybdenum-nickel alloy layer forms a nickel silicide layer in the boundary between the molybdenum-nickel alloy layer and the silicon wafer by heat treatment. By this nickel silicide layer, an ohmic contact of low resistance is obtained between the alloy layer and the silicon wafer, and thus the characteristics of the silicon wafer are kept free of external influences.

As described above, the content of nickel in the molybdenum-nickel alloy must be in the range of about 5 to about 50 percent by weight.

It is known in the art that nickel makes available a low-resistance ohmic contact with silicon. To obtain such low ohmic contact in the prior art, a nickel layer is formed on the silicon wafer by the non-electrolytic plating or vacuum evaporation method, and the silicon wafer is heated to about 750° C whereby a nickel silicide layer is formed in the boundary between the silicon wafer and nickel layer. However, nickel has poor bonding characteristics as regards silicon oxide and is easily alloyed with gold, silver and copper. To make nickel maintain a good bonding characteristic with respect to silicon oxide and not to lower the effect of nickel in its role as the barrier against diffusion of gold, silver or copper into silicon, the content of nickel in the molybdenum-nickel alloy should be about 5 to about 50 percent by weight.

These and other objects and advantages of the present invention will become apparent to those skilled in the art from a consideration of the following specification and claims, taken in conjunction with the accompanying drawings.

DESCRIPTION OF PREFERRED EMBODIMENTS

Figure 1:
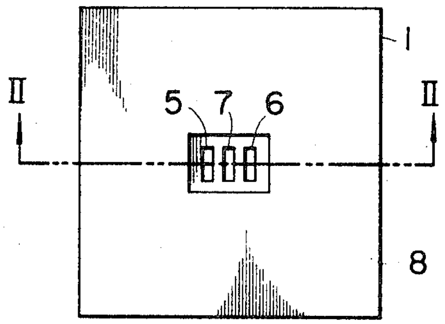
FIG. 1 is a plan view of a silicon wafer having a planar transistor, in which holes are provided on the silicon oxide coating for the purpose of contact formation.
Figure 2:
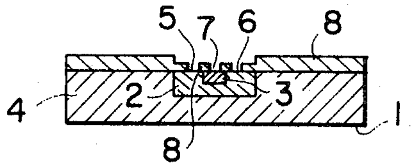
FIG. 2 is a sectional view taken along line II—II in FIG. 1.

Referring to FIGS. 1 and 2, a semiconductor wafer 1 has a transistor comprising a base region 2 and an emitter region 3. The rest of the region on the substrate 1 serves as a collector region 4. This transistor is formed according to usual semiconductor device manufacturing techniques. A silicon oxide coating 8 having holes 5, 6, and 7 is provided on the wafer 1. The holes 5 and 6 are for the base contact, and the hole 7 is for the emitter contact. A collector contact is installed on the base surface of the wafer 1.

The double layer made of molybdenum-nickel alloy and gold of this invention is formed in the following manner.

The sputtering method is desirable for forming the contact layer of this invention. Instead, the known vacuum evaporation method may also be used for same purpose.

The sputtering apparatus comprises a chamber 20, a table 21, and a bell jar 22 installed on the table 21. A hole 23 of the table 21 is connected to a vacuum pump for withdrawing air from the chamber 20, and a hole 24 is connected to a rare gas tank. A sample table 25 made of metal is disposed above the table 21. A heater is buried in the sample table 25 to heat a plurality of silicon wafers 26 to the desired temperature such as 600° to 700° C. Several hundred pieces of transistors shown in FIGS. 1 and 2 are comprised in each silicon wafer 26.

A gold sputtering cathode plate 30 comprising a gold plate is disposed above the sample table 25. A molybdenum-nickel alloy sputtering cathode plate 29 having a nickel plate 28 on a molybdenum disk 27 is disposed above the sample table 25. These cathode plates 29 and 30 are alternately brought into a position directly above the sample table 25 by means of a rotating shaft (not shown) which serves at the same time as a conductor, is extended to the exterior through the top of the bell jar 21. An external DC high voltage source is connected thereto so that the sample table 25 acts as a positive electrode, and the cathode plates 29 and 30 as negative electrodes. A voltage of several killovolts is applied across the two electrodes.

A silicon wafer 26 is placed on the sample table 25, the pressure inside the chamber 20 is kept at about $10^{-6}$ Torr by withdrawing air therefrom, a rare gas such as argon is supplied to the chamber via the hole 24 and, after supplying argon, the pressure inside the chamber is about $10^{-1}$ to about $10^{-3}$ Torr, and a DC voltage of several kilovolts is applied between the cathode plate 29 and the sample table 25. As a result thereof a glow discharge occurs whereby the cathode material is sputtered to form a molybdenum - nickel alloy layer on the whole surface of the silicon wafer 26. When the DC voltage is applied between the mutually facing cathode plate 30 and sample table 25, a gold layer is then formed on the wafer.

Figure 3:
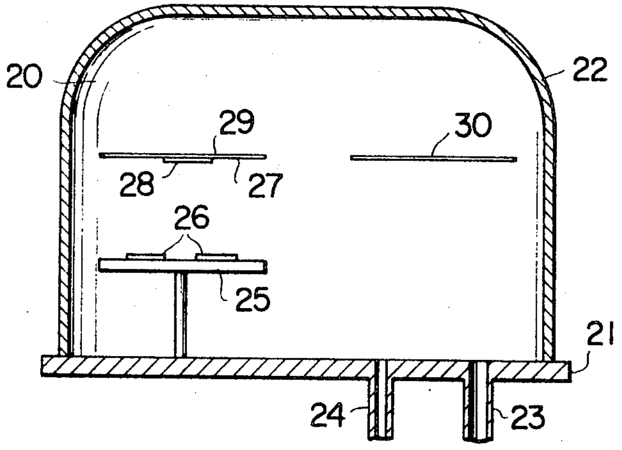
FIG. 3 is a schematic diagram showing a sputtering apparatus used when forming a contact layer according to this invention.

In the process for sputtering the molybdenum-nickel alloy, the nickel sputtering speed is twice the molybdenum sputtering speed under the same discharge condition. As a result, the area ratio of nickel to molybdenum on the cathode plate 29 differs from the composition ratio of the sputtered alloy layer, and the content of nickel in the alloy becomes larger than this area ratio. The ion bombardment density is high in the periphery of the cathode plate, and the sputtering speed in this peripheral area is high. This means that the composition of the alloy depends upon the shape of the nickel and molybdenum materials and the state of distribution of nickel and molybdenum on the cathode plate, as well as on the area ratio of nickel to molybdenum on the cathode plate. Therefore, to obtain a molybdenum-nickel alloy layer containing, for example, 30 percent of nickel by weight, it is necessary to constitute the molybdenum-nickel area ratio on the cathode plate to be slightly larger than 7: 1.5. The results of experiments thereof show that a molybdenum-nickel alloy layer with the desired composition is obtained with an area ratio of about 6. 5:1. 5 when a cathode plate 29 as shown in FIG. 3 is used.

Thus, by suitably predetermining the relationship between the molybdenum-nickel area ratio and the composition ratio of the sputtered alloy layer, a molybdenum -nickel alloy layer with the desired composition can be easily obtained, compared with the vacuum evaporation method.

The invention will be more specifically described by way of concrete examples using the sputtering apparatus.

EXAMPLE 1

Figure 4:
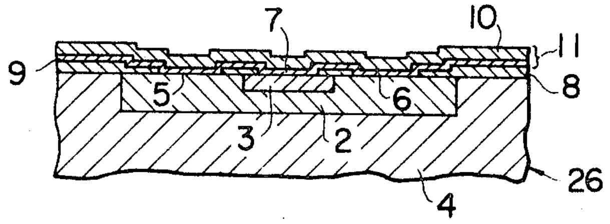
FIG. 4 is a partly enlarged sectional view taken along Line II—II, showing the structure of the silicon wafer (FIG. 1) having a contact layer.

A sputtering apparatus as shown in FIG. 3 is used. A silicon wafer 26 comprising many numbers of transistors (FIGS. 1 and 2) in nonsplit state is placed on the sample table 25 with its silicon oxide coating surface up. The pressure inside the chamber 20 is kept at $10^{-6}$ Torr by withdrawing air. Then, argon gas is introduced into the chamber to keep the pressure at $10^{-3}$ to $3 \times 10^{-3}$ Torr. The molybdenum-nickel alloy sputtering cathode plate 29 is brought into position directly above the sample table 25. A DC voltage is applied between the cathode plate 29 and the sample table 25. As a result thereof, the sputtering starts. Thus, as shown in FIG. 4, a molybdenum-nickel alloy layer 9 containing 40 percent of nickel by weight is formed on the whole surface of the silicon wafer 26 to a thickness of about 3,000A.

The silicon wafer 26 is heated to 650° C whereby nickel contained in the molybdenum-nickel alloy layer 9 is diffused into the silicon wafer and thus a nickel silicide layer is formed in the boundary between the silicon wafer 26 and the alloy layer 9. Therefore the alloy layer 9 establishes an ohmic contact with the silicon wafer at a low resistance.

After this process, the silicon wafer is cooled to a temperature below 200° C. Under this condition, gold is sputtered by using the gold sputtering cathode plate 30. Thus, as shown in FIG. 4, a gold layer 10 is formed to a thickness of 5,000 to 10,000 A on the molybdenum-nickel alloy layer 9 over the whole surface of the silicon wafer 26.

After forming the molybdenum-nickel alloy layer 9 and gold layer 10, the silicon wafer 26 is withdrawn from the chamber 20 and is subjected to the following treatment for forming electrodes and interconnections.

The gold layer 10 is coated with a photoresist film having an electrode and interconnection pattern by known photoresist techniques. Then, two steps of an etching process are applied to the silicon wafer in order to remove part of the gold layer, which part is not covered with the photoresist film and to remove also part of the molybdenum-nickel layer located beneath this part of the gold layer.

The first step is to etch the gold layer. More, particularly, one gram of iodine and four grams of iodine potassium are dissolved into 20 cc of water. A very small amount of surface active agent is added to this iodine potassium aqueous solution. The unnecessary part of the gold layer is removed by the use of this solution. After this treatment, the silicon wafer 26 is thoroughly rinsed with water to remove the etching solution.

The second etching step is for the molybdenum-nickel alloy layer. The molybdenum-nickel alloy layer exposed after removal of the gold layer is etched by a mixture solution of 60cc of 60 percent phosphoric acid. 10cc of nitric acid and 10cc of water.

The remainder of the photoresist film on the gold layer (beneath which the molybdenum-nickel alloy layer exists) after the above etching processes is removed by being rinsed in a solution such as a methlene chloride solution.

Figure 5:
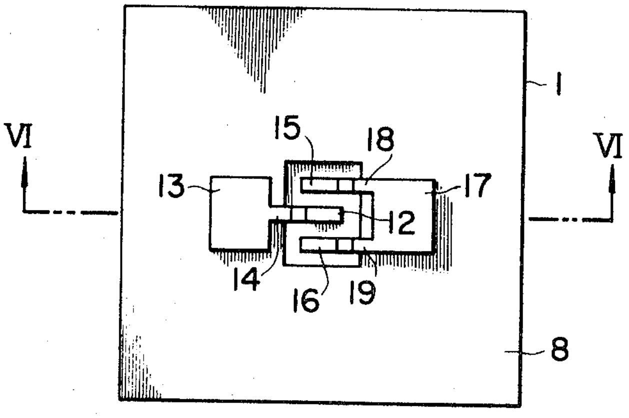
FIG. 5 is a plan view showing the structure of the silicon wafer (FIG. 1) having a contact layer and interconnection layer.
Figure 6:
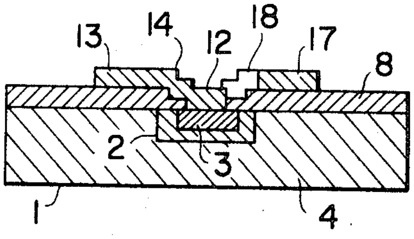
FIG. 6 is a sectional view taken along line VI—VI in FIG. 5.

After the above wiring process, the silicon wafer 26 is scribed and split into individual pieces, namely silicon substrates 10. Each of the silicon substrates 10 has a contact pattern as shown in FIG. 5. FIG. 6 shows a cross section taken along line VI—VI in FIG. 5.

An emitter contact 12 formed on the emitter region 3 is connected over the emitter-base junction to an emitter lead electrode 13 by way of a wiring 14 formed on the silicon oxide coating 8. Base contacts 15 and 16 formed on the base region 2 are connected over the base collector junction to a base lead electrode 17 by way of lead wires 18 and 19 which are formed on the silicon oxide coating 8. Gold lead wires for connections to an external circuit are connected to these lead electrodes 13 and 17 by thermocompression bonding.

Figure 7:
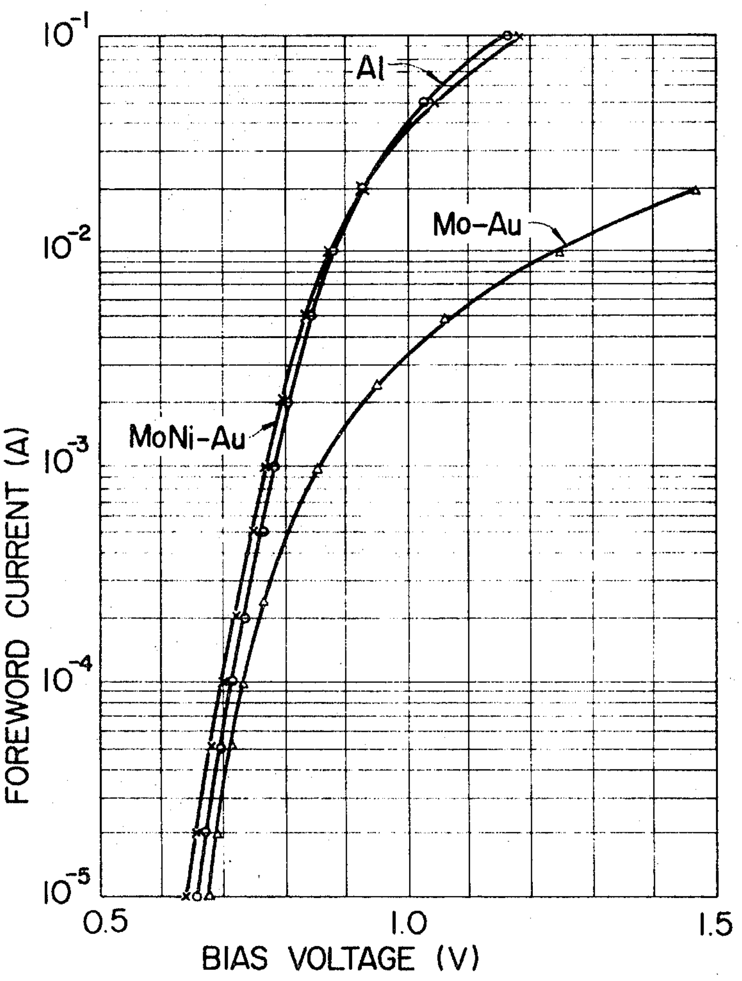
FIG. 7 is a graphic representation showing the forward current characteristic of a diode having the contact layer and interconnection layer of this invention.

FIG. 7 shows the forward current characteristic of a diode with the double layer electrode wiring composed of a molybdenum-nickel layer and of a gold layer formed in the foregoing manner. FIG. 7 shows also the forward current characteristic of a diode with electrode wiring using molybdenum and aluminum.

From FIG. 7, it is apparent that the forward current of the diode with the molybdenum-nickel alloy electrode layer of this invention is similar to that of the diode with an aluminum electrode and is larger than that of the diode with a molybdenum electrode. Hence it is obvious that the double layer electrode of this invention has a low contact resistance against silicon, in comparison with the molybdenum electrode.

Molybdenum tends to be electrochemically corroded in a high humidity atmosphere (Ref: J. J. Bart, IEEE Transaction ED-16, 351, 1969), whereas, the molybdenum-nickel alloy used in the present invention is more resistant against corrosion than molybdenum. The present invention thus employs such molybdenum-nickel alloy to additional advantages.

EXAMPLE 2

A silicon wafer 26 similar to that used in Example 1 is placed on the sample table 25 of the sputtering apparatus shown in FIG. 3. The pressure inside the chamber 20 is kept at about $10^{-6}$ Torr by withdrawing air therefrom. Then, argon gas is introduced into the chamber, and the pressure inside the chamber is kept at about $1-3 \times 10^{-3}$ Torr. The sample table 25 is heated to 400° C and molybdenum-nickel alloy is sputtered. The nickel content in the sputtered alloy should be 15 percent by weight in this example.

The silicon wafer with the deposited molybdenum-nickel alloy is heated to 700° C for 5 minutes. As a result thereof, nickel is diffused into silicon whereby a nickel silicide layer is formed therebetween and a low resistance contact is established.

After this process, the silicon wafer is cooled to about 150° C. At this temperature, a gold layer, silver-gold double layer or copper-gold double layer is formed on the molybdenum-nickel alloy layer to a thickness of about 6,000 to about 10,000A as in the foregoing manner (Example1). Thus a diode is obtained as in Example 1. This diode displays similar characteristics as in Example 1.

It is apparent to those skilled in the art that the method of this invention for the formation of highly useful electrode and interconnection layers can be effectively applied also to integrated circuits of any known type. Furthermore, the present invention is equally applicable to silicon semiconductor devices with other known types of single or multiple passivation films in lieu of or in addition to the silicon oxide coating 8 described herein.

While the principles of the invention have been described above in connection with specific embodiments, and particular modifications thereof, it is to be clearly understood that this description is made only by way of example and not as a limitation on the scope of the invention. Consequently, we do not wish to be limited to the details shown and described herein but intend to cover all such changes and modifications as are encompassed by the scope of the appended claims.

We claim:

1. In a semiconductor device having an electrode and interconnection layer arrangement, in which a silicon wafer has two mutually opposite conductivity regions in close proximity of one of its surfaces, the p-n junction formed between said two regions is extended from the inside toward the surface of the silicon wafer, a silicon oxide coating is formed on said wafer, holes are disposed on said coating by removing part of the silicon oxide coating above said regions, metallic layers for contact and interconnection are formed over the exposed part of said two regions in said holes, and said metallic layers are extended from said holes out over said silicon oxide coating; characterized in that a contact and interconnection layer comprises a first layer containing an alloy consisting of molybdenum and nickel formed on a respective region and on said silicon oxide coating, said alloy having about 5 to about 50 percent of nickel content by weight, and a gold layer formed on said first layer, with a thin nickel silicide layer in the boundary between the respective region and said first layer.

2. In a semiconductor device having a contact and interconnection layer arrangement in which the silicon wafer has two mutually opposite conductivity regions in close proximity of one of its surfaces, the p-n junction formed between said two regions is extended from the inside toward the surface of the silicon wafer, a silicon oxide coating is formed on said wafer, holes are disposed on said coating by removing part of the silicon oxide coating above said regions, metallic layers for contact and interconnection are formed over the exposed part of said two regions in said holes, and said metallic layers are extended from said holes out over said silicon oxide coating; characterized in that a contact and interconnection layer comprises a first layer containing an alloy consisting of molybdenum and nickel formed on a respective region and on said silicon oxide coating, said first layer having about 5 to about 50 percent of nickel content by weight, a thin layer made of silver or copper on said first layer, and a thin gold layer formed on said silver or copper thin layer, with a thin nickel silicide layer in the boundary between the respective region and said first layer.

3. In a semiconductor device having at least one semiconductor region covered on a major surface by a passivation film, with a portion of the silicon semiconductor region exposed in said major surface through an opening in said passivation film, the improvement comprising an electrode and interconnection layer arrangement capable of forming a low ohmic contact with said exposed silicon semiconductor region and extending over a part of said passivation film, including a first layer containing an alloy consisting of molybdenum and nickel and a gold layer on said first layer, said first layer containing about 5 percent to about 50 percent of nickel by weight and forming a thin low ohmic layer of a compound from nickel and the material of the silicon semiconductor region within the boundary area between said region and said first layer.

4. The combination according to claim 3, wherein said first layer and said gold layer are substantially coextensive.

5. The combination according to claim 3, wherein a thin layer of a conductive material selected from the group essentially consisting of silver and copper is disposed between said first layer and said gold layer.

6. The combination according to claim 5, wherein said passivation film includes an oxide of the material of said semiconductor region.

7. The combination according to claim 3, wherein said passivation film includes an oxide of the material of said semiconductor region.

* * * * *